United States Patent [19]
Goronkin et al.

[11] Patent Number: 5,659,179
[45] Date of Patent: Aug. 19, 1997

[54] ULTRA-SMALL SEMICONDUCTOR DEVICES HAVING PATTERNED EDGE PLANAR SURFACES

[75] Inventors: Herbert Goronkin, Tempe; Saied N. Tehrani, Scottsdale; Martin Walther, Chandler; Raymond Tsui, Phoenix, all of Ariz.

[73] Assignee: Motorola, Schaumburg, Ill.

[21] Appl. No.: 399,809

[22] Filed: Mar. 7, 1995

[51] Int. Cl.$^6$ .................................................. H01L 29/06
[52] U.S. Cl. ........................... 257/25; 257/12; 257/14; 257/24; 257/37; 257/623
[58] Field of Search ............................. 257/12, 14, 25, 257/623, 37, 24

[56] References Cited

U.S. PATENT DOCUMENTS 4,939,556  7/1990  Eguchi et al. .......................... 257/25
5,428,224  6/1995  Hayashi et al. ......................... 257/25

FOREIGN PATENT DOCUMENTS 0642373  1/1989  Japan ....................................... 257/24

*Primary Examiner*—Mahshid D. Saadat
*Assistant Examiner*—Valencia Martin Wallace
*Attorney, Agent, or Firm*—Eugene A. Parsons

[57] ABSTRACT

Ultra-small semiconductor devices and a method of fabrication including patterning the planar surface of a substrate to form a pattern edge (e.g. a mesa) and consecutively forming a plurality of layers of semiconductor material in overlying relationship to the pattern edge so that a discontinuity is produced in the layers and a first layer on one side of the pattern edge is aligned with and in electrical contact with a different layer on the other side of the pattern edge.

8 Claims, 3 Drawing Sheets

ULTRA-SMALL SEMICONDUCTOR DEVICES HAVING PATTERNED EDGE PLANAR SURFACES

FIELD OF THE INVENTION

The present invention pertains to ultra-small semiconductor devices and more specifically to improved techniques for fabricating ultra-small semiconductor devices.

BACKGROUND OF THE INVENTION

Generally, in the semiconductor industry the most difficulty and/or problems occur with the formation of external electrical connections and with interconnections to different components on a single substrate. Semiconductor devices are typically fabricated on a planar substrate by sequentially growing or depositing several different layers of material and then patterning or etching one or more of the layers to expose a lower surface. Metal is then deposited on the exposed surfaces for interconnections or external connections.

One problem in this process is that the etching requires masking which adds several complicated steps to the process and, consequently, a large amount of labor and cost. Also, the metal contacts require a relatively large amount of real estate and, consequently, many semiconductor devices are limited in size by the ability to provide external connections to them.

Accordingly, it would be highly advantageous to provide semiconductor devices and methods of manufacture which do not include additional etching steps for the formation of interconnections and external connections.

It is a purpose of the present invention to provide novel ultra-small semiconductor devices and methods of fabrication and connection.

It is another purpose of the present invention to provide novel ultra-small semiconductor devices and methods of fabrication and connection in which at least some of the interconnections are formed automatically during the formation of the various layers.

It is still another purpose of the present invention to provide novel ultra-small semiconductor devices and methods of fabrication and connection in which external terminals and interconnections are formed without requiring additional masking and etching steps.

It is a further purpose of the present invention to provide novel ultra-small semiconductor devices which are smaller than previously possible with standard external terminals.

It is still a further purpose of the present invention to provide novel ultra-small semiconductor devices using simplified methods of fabrication and connection.

SUMMARY OF THE INVENTION

The above problems are at least partially solved and the above purposes are realized in an ultra-small semiconductor device and a method of fabrication including patterning the planar surface of a substrate to form a pattern edge (e.g. a mesa) and consecutively forming a plurality of layers of semiconductor material in overlying relationship to the pattern edge so that a discontinuity is produced in the layers and a first layer on one side of the pattern edge is aligned with and in electrical contact with a different layer on the other side of the pattern edge.

Thus, electrical interconnections between different layers of the device are automatically formed during fabrication. Contacts are formed on opposite sides of the discontinuity to complete the device.

BRIEF DESCRIPTION OF THE DRAWINGS

Referring to the drawings.

DESCRIPTION OF THE PREFERRED EMBODIMENTS

Figure 1:
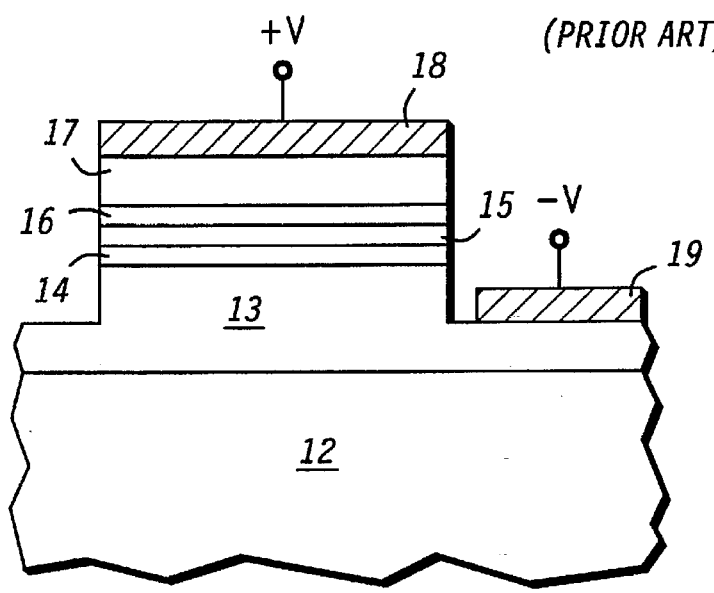
FIG. 1 is a simplified sectional view of a prior art resonant interband tunneling diode.

Referring specifically to FIG. 1, a conventional resonant tunneling diode (RTD) 10 is illustrated. Diode 10 is an example of a heterostructure device fabricated on a planar GaSb substrate 12 by the epitaxial growth of sequential layers in the InAs/AlSb/GaSb material system. In the fabrication of diode 10, a first low resistance access layer 13 is epitaxially grown on the planar surface of substrate 12, after which a first barrier layer 14, an active quantum well layer 15, a second barrier layer 16 and a second low resistance access layer 17 are sequentially grown.

A first metal contact 18 is formed on the surface of second access layer 17 by any of the conventional evaporation and patterning techniques. Metal contact 18 is then used as a mask to etch the various layers so as to form the usual mesa configuration which separates the layers into diode 10. A second metal contact 19 is then evaporated onto the surface of a remaining portion of access layer 13 to form a second external terminal for diode 10.

As will be understood by those skilled in the art, several steps are required to pattern metal contact 18 on the surface of access layer 17. Some special etching is required to form the ideally vertical side walls of the mesa without damaging the various layers and reducing the life expectancy of diode 10. For example, the three materials of the diode, InAs, GaSb and AlSb, have different characteristics and etch at different rates in a mesa etch solution. Therefore, the sidewall form cannot be easily controlled. Also, several additional steps are required to pattern metal contact 19 in electrical contact with access layer 13, again without damaging the other exposed layers or producing shorts and the like therebetween. Further, access layer 13 must be grown substantially thicker than the other layers to provide sufficient material for etching deep enough to completely isolate the various layers of diode 10 while retaining a sufficient thickness to carry the current of diode 10 to metal contact 19.

Figure 2:
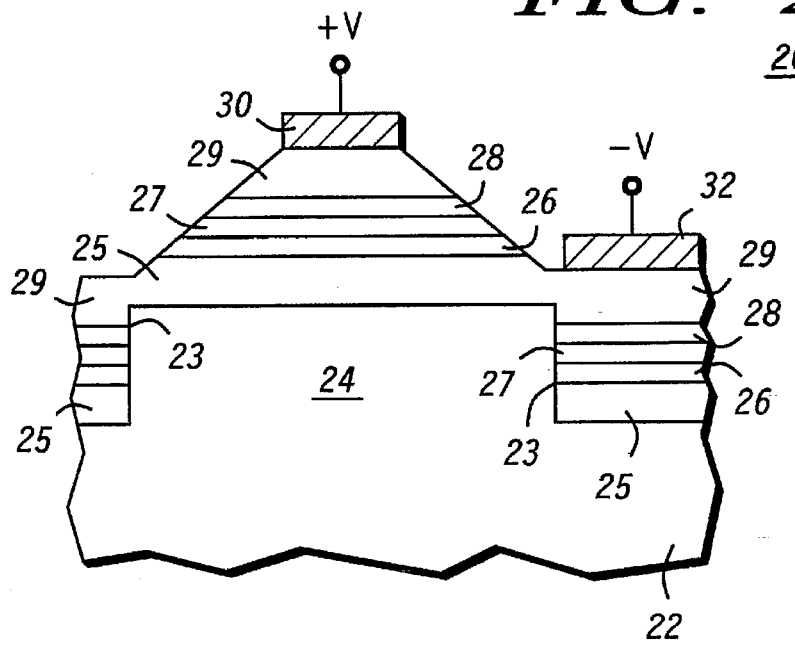
FIG. 2 is a simplified sectional view of a resonant interband tunneling diode embodying the present invention.

Referring now to FIG. 2, a novel resonant tunneling diode (RTD) 20 is illustrated which embodies the present invention. It should be understood that this is only one example of a typical heterostructure device that can be fabricated using the novel techniques to be described. As explained in conjunction with diode 10 of FIG. 1, diode 20 is fabricated on a GaSb substrate 22 by the epitaxial growth of sequential layers in the InAs/AlSb/GaSb material system. It will of course be understood that other materials and other material systems may be used and the following is simply given for purposes of explanation.

In the fabrication of diode 20, substrate 22 is first patterned to form one or more pattern edges, represented by a single pattern edge 23. In this specific embodiment substrate 22 is etched to form a mesa 24 defining pattern edge 23 around the upper surface thereof. It will of course be understood that a wide variety of pattern edges can be formed on substrate 22, depending upon the specific devices being fabricated and the number of devices and circuits being formed on a wafer. It is important to note that the patterning and etching, etc. is performed on wafer 22 prior to the formation of any other structures or layers so that these steps are substantially simplified. The epitaxial growth then takes place on a patterned substrate, rather than a planar substrate.

Once substrate 22 is completely patterned, a plurality of epitaxial layers are sequentially grown on the surface. Again using diode 20 as an example, a first access layer 25 is epitaxially grown on the planar surface of substrate 22 and over pattern edge 23 so as to overlie both sides of pattern edge 23. A first barrier layer 26, an active quantum well layer 27, a second barrier layer 28 and a second access layer 29 are sequentially grown on access layer 25. As will be understood, layers 25, 26, 27, 27, 28 and 29 are epitaxially grown by any convenient technique, including but not limited to MBE, MOCVD, CBE, etc.

The growth rate of a crystallographic plane is determined by the sticking coefficient of the adatoms and their migration length. Sticking coefficients and adatom migration lengths depend strongly on adatom species, crystallographic planes and growth parameters, and can vary over a wide range. The morphology of overgrown structures is therefore strongly affected by the faceted growth behavior at the pattern edges. The initial shape of the structure is changed during growth and distinguished crystallographic planes are formed at the pattern edges. The thicknesses of these individual layers depends on the crystallographic plane, the adatom species and the growth parameters. Gallium, for example, has a very low sticking coefficient on (111)B facets and a high migration length on these planes. Therefore, Ga is not likely to nucleate on these planes. Aluminum, in contrast, has a high sticking coefficient and a low migration length on these facets. As a result, different growth rates and different layer thicknesses are obtained on (111)B facets for these materials. Dependent on the growth conditions and the specific material, facets with very low growth rates can be obtained, These planes are usually called non-growth planes.

The growth of layers 25-29 over pattern edge 23 uses the faceted growth behavior so that a discontinuity is produced in layers 25-29 at pattern edge 23. Generally, the facet formation next to pattern edge 23 during epitaxial growth on substrate 22 is determined by the crystallographic orientation, the adatom species and the growth parameters. Using the faceted growth behavior at pattern edge 23, first access layer 25 grown on one side of pattern edge 23 (on top of the mesa) is aligned with and in electrical contact with second access layer 29 grown on the other side of pattern edge 23.

A crucial point in the fabrication of diode 20 is to avoid shorts between first access layer 25 grown on one side of pattern edge 23 (on the mesa) and first access layer 25 grown on the other side of pattern edge 23. This complete discontinuity is achieved by choosing an appropriate etch depth (the height of the mesa), pattern orientation and thickness of epitaxial layers 25-29. Generally, it is desired to make pattern edge 23 as sharp as possible and the height of the mesa greater than the total thickness of layers 25-28 but less than a total thickness of layers 25-29.

In this specific example, the dimensions of diode 20 are 50 μm×50 μm and layers 25 and 29 are formed of InAs approximately 100 nm thick. Barrier layers 26 and 28 are formed of AlSb approximately 2.5 nm thick and active quantum well layer 27 is formed of GaSb approximately 6.5 nm thick. The mesa defining pattern edge 23 is formed with a height approximately 500 nm.

With layers 25-29 completely grown and first access layer 25 grown on one side of pattern edge 23 (on top of the mesa) aligned with and in electrical contact with second access layer 29 grown on the other side of pattern edge 23, diode 20 is completed by forming external contacts or terminals thereto. This is accomplished simply by evaporating ohmic contacts by the lift-off technique onto the surface of diode 20 to form a first contact 30 on layer 29 on a first side of pattern edge 23 (on top of the mesa) and a second contact 32 on layer 29 on the opposite side of pattern edge 23. In this embodiment, layers 25-28 on the side of pattern edge 23 opposite the mesa are not connected and simply fill the groove around the mesa.

Figure 3:
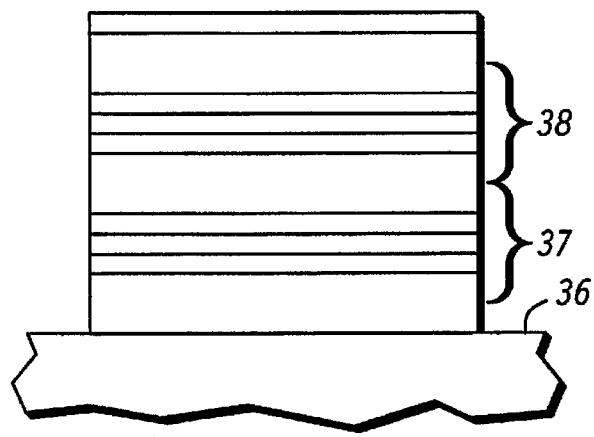
FIG. 3 is a simplified sectional view of a prior art stack of two resonant tunneling diodes.

Referring now to FIG. 3, a prior art stack 35 of resonant tunneling diodes (RTD) is illustrated in a simplified sectional view. Stack 35 includes a substrate 36 having a first double barrier RTD 37 deposited thereon with a second double barrier RTD 38 deposited on first RTD 37. Electrical contact can only be made through a top contact on top of RTD 38 and to the bottom of RTD 37 by means of a conductive layer initially formed on substrate 36. It is not practically possible in the prior art to contact the junction of RTDs 37 and 38, unless top RTD 38 is etched to form a mesa on lower RTD 37. In this case RTD 37 must be larger in cross-sectional area than RTD 38, which seriously limits the size of both devices.

Figure 4:
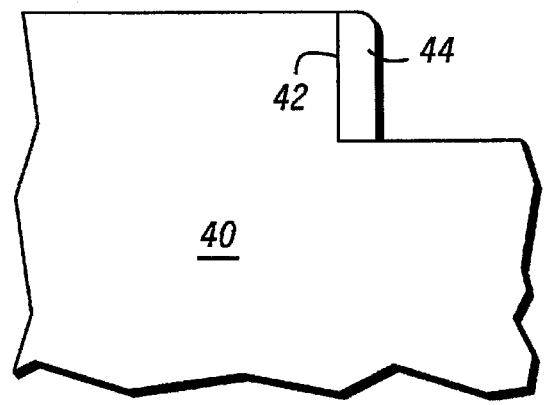
FIGS. 4 and 5 are simplified sectional views of intermediate steps in the formation of a stack of resonant tunneling diodes in accordance with the present invention.

A novel ultra-small semiconductor device which is smaller than previously possible with standard external terminals will now be explained. Referring specifically to FIG. 4, a substrate 40 is illustrated having a first pattern edge 42 formed therein by any convenient patterning technique. A dielectric layer is then conformally deposited over the entire surface of substrate 40, including the sidewall of pattern edge 42. The dielectric layer can be any convenient material, such as $Si_3N_4$, $SiO_2$, etc. The dielectric layer is then anisotropically etched to form a side wall spacer 44. Generally, as will be understood by those skilled in the art, the thickness of spacer 44, at the bottom thereof (which is the desired dimension), is controlled by the initial thickness of the dielectric layer.

Figure 5:
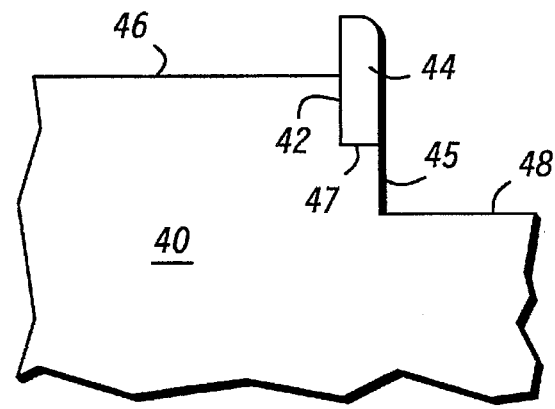

With spacer 44 formed to the desired thickness on the sidewall of first pattern edge 42, a second etch of substrate 40 is performed using spacer 44 as a mask. As illustrated in FIG. 5, the second etch results in a second pattern edge 45 spaced laterally (and vertically) from first pattern edge 42. Thus, an upper surface 46 is defined to one side of pattern edge 42, a step surface 47 is defined between pattern edges 42 and 45 and a lower surface 48 is defined to the opposite side of pattern edge 45. It is important to note two things at this time: first, all of the patterning and etching is performed on substrate 40 prior to forming any of the layers of the semiconductor device so no damage can occur to these layers; and second, the size of step surface 47 is controlled by the thickness of the dielectric layer and much smaller geometries can be achieved than can be realized by using standard lithography.

Figure 6:
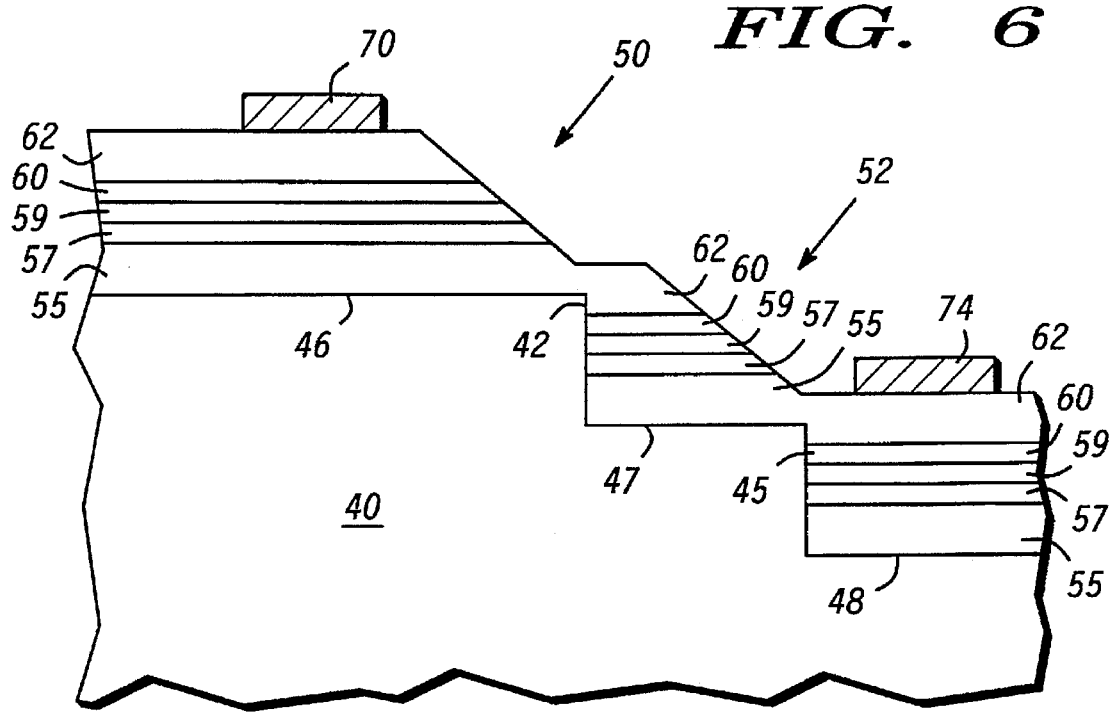
FIG. 6 is a simplified sectional view of a stack of resonant tunneling diodes embodying the present invention.

Referring now to FIG. 6, substrate 40 (of FIG. 5) is illustrated with stacked double barrier diodes 50 and 52 formed thereon. A plurality of layers of semiconductor material are sequentially formed on the upper surface of substrate 40 so as to overlie both sides of both pattern edges 42 and 45. In this specific embodiment, the plurality of layers are epitaxially grown to form a first access layer 55 on the surface of substrate 40, a first barrier layer 57 on layer 55, an active quantum well layer 59 on first barrier layer 57, a second barrier layer 60 on active quantum well layer 59 and a second access layer 62 on second barrier layer 60.

Pattern edges 42 and 45 are selected to be no-growth facets. Using the faceted growth behavior at pattern edges 42 and 45, first access layer 55 grown on one side of pattern edge 42 (on surface 46) is aligned with and in electrical contact with second access layer 62 grown on the other side of pattern edge 42 (on surface 47) and first access layer 55 grown on one side of pattern edge 45 (on surface 47) is aligned with and in electrical contact with second access layer 62 grown on the other side of pattern edge 45 (on surface 48).

Diodes 50 and 52 are completed by forming external contacts or terminals thereto. This is accomplished simply by evaporating ohmic metal contacts by the lift-off technique onto the surface of layer 62 in overlying relationship to surfaces 46, 47 and 48 of substrate 40. In this fashion, a first contact 70 is formed on layer 62 on a first side of pattern edge 42, which operates as a first terminal for diodes 50 and 52. Also, a second contact 74 is formed on layer 62 on the opposite side of pattern edge 45 and operates as a second terminal for diode 52. In this embodiment, layers 55, 57, 59 and 60, on the side of pattern edge 45 opposite step surface 47 are not connected and simply fill the groove adjacent pattern edge 45.

Figure 7:
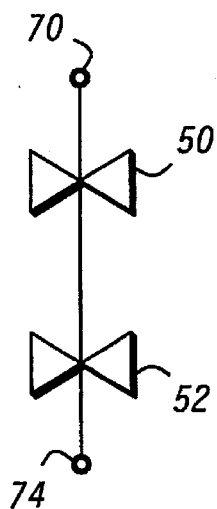
FIG. 7 is a schematic representation of the stack of resonant tunneling diodes illustrated in FIG. 6.

Referring specifically to FIG. 7, a schematic representation of stacked diodes 50 and 52 is illustrated. As can be seen in FIG. 7, diode 50 is connected between and layer 55 and diode 52 is connected between layer 62 terminal 74. In special applications, the area of diode 50 can be made much larger than the area of diode 52 so that diode 50 is essentially an ohmic contact for diode 52. In this application diode 52 can be made so small that external electrical contact cannot be made by conventional methods. However, in the disclosed embodiment diode 52 can be made as small as desired and external connections are made through larger diode 50 and contact 74. Further, because of the novel technique for constructing step surface 47, diode 52 can be made much smaller than was previously possible using standard lithographic techniques.

Accordingly, novel semiconductor devices and methods of manufacture are disclosed which eliminate many patterning and/or etching steps in the formation of the semiconductor devices and interconnections and external connections therefor. Further, the patterning and etching steps which are used in the present novel devices and methods are performed prior to the formation of any active layers in the devices so that there is no danger of damage and/or contamination. Further, novel ultra-small semiconductor devices and methods of fabrication and connection are disclosed in which at least some of the interconnections are formed automatically during the formation of the various layers. Also, novel ultra-small semiconductor devices which are smaller than previously possible with standard external terminals are disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor device comprising:

a supporting substrate with a planar surface;

a first pattern edge formed on the planar surface of the substrate; and a plurality of overlying layers of material including at least a lower layer, an intermediate layer, and an upper layer, at least partially defining a semiconductor device, consecutively positioned in overlying relationship on opposite sides of the first pattern edge so that a discontinuity is produced in the layers at the first pattern edge and the lower layer of the plurality of layers on one of the opposite sides of the first pattern edge is aligned with and in electrical contact with the upper layer of the plurality of layers on another of the opposite sides of the first pattern edge.

2. A semiconductor device as claimed in claim 1 wherein the first pattern edge is formed by a mesa with a selected height on the surface of the substrate and the pattern edge is defined by an edge of the mesa.

3. A semiconductor device as claimed in claim 2 wherein the height of the mesa is less than a total thickness of the plurality of layers.

4. A semiconductor device as claimed in claim 1 and further including an electrical contact on an upper surface of the plurality of layers of material on each of the opposite sides of the first pattern edge, the electrical contacts defining two terminals of the semiconductor device.

5. A semiconductor device as claimed in claim 1 including in addition a second pattern edge laterally spaced a selected distance from the first pattern edge.

6. A semiconductor device as claimed in claim 5 wherein the first pattern edge includes a mesa with a selected height on the surface of the substrate, and the second pattern edge defines a step surface between the second pattern edge and the first pattern edge, the step surface having a height less than the selected height of the mesa.

7. A semiconductor device comprising;

a supporting substrate with a planar surface;

a first pattern edge formed on the planar surface of the substrate; and a plurality of overlying layers of material, at least partially defining a semiconductor device, consecutively positioned in overlying relationship on opposite sides of the first pattern edge so that a discontinuity is produced in the layers at the first pattern edge and a first layer of the plurality of layers on one of the opposite sides of the first pattern edge is aligned with and in electrical contact with a different layer of the plurality of layers on another of the opposite sides of the first pattern edge, wherein the plurality of overlying layers of material include a first access layer, a first barrier layer on the first access layer, an active layer on the first barrier layer, a second barrier layer on the active layer, and a second access layer on the second barrier layer, and the first access layer on one of the opposite sides of the discontinuity is aligned with and in electrical contact with the second access layer on the another of the opposite sides of the discontinuity.

8. A semiconductor device comprising:

a supporting substrate with a planar surface;

a first pattern edge formed on the planar surface of the substrate;

a second pattern edge laterally spaced a selected distance from the first pattern edge; and a plurality of overlying layers of material, at least partially defining a semiconductor device, in overlying relationship to first and second opposite sides of each of the first and second pattern edges so that discontinuities are produced in the layers at each of the first and second pattern edges and a first layer of the plurality of layers on the first opposite side of the first pattern edge is aligned with and in electrical contact with a second layer of the plurality of layers on the second opposite side of the first pattern edge and a third layer of the plurality of layers on the first opposite side of the second pattern edge is aligned with and in electrical contact with a fourth layer of the plurality of layers on the second opposite side of the second pattern edge.

* * * * *